(12) United States Patent
Ximenes et al.

(10) Patent No.: US 9,374,036 B2
(45) Date of Patent: Jun. 21, 2016

(54) SPLIT TRANSFORMER BASED LC-TANK DIGITALLY CONTROLLED OSCILLATOR

(71) Applicants: Augusto Ronchini Ximenes, The Hague (NL); Robert Bogdan Staszewski, Dublin (IE)

(72) Inventors: Augusto Ronchini Ximenes, The Hague (NL); Robert Bogdan Staszewski, Dublin (IE)

(73) Assignee: Short Circuit Technologies LLC, Rochester, NY (US)

( * ) Notice: Subject to any disclaimer, the term of this patent is extended or adjusted under 35 U.S.C. 154(b) by 0 days.

(21) Appl. No.: 14/831,091

(22) Filed: Aug. 20, 2015

(65) Prior Publication Data

US 2016/0056762 A1 Feb. 25, 2016

Related U.S. Application Data

(60) Provisional application No. 62/039,481, filed on Aug. 20, 2014.

(51) Int. Cl.
*H03B 5/12* (2006.01)
*H03B 1/00* (2006.01)
*H03K 3/015* (2006.01)
(Continued)

(52) U.S. Cl.
CPC ............ *H03B 5/1265* (2013.01); *G04F 10/005* (2013.01); *H03B 1/00* (2013.01); *H03B 5/1215* (2013.01); *H03B 5/1228* (2013.01); *H03B 5/1296* (2013.01); *H03K 3/015* (2013.01); *H03K 3/0315* (2013.01); *H03L 7/0802* (2013.01); *H03L 7/0893* (2013.01); *H03L 7/093* (2013.01); *H03L 7/1976* (2013.01); *H03M 1/002* (2013.01); *H03M 1/201* (2013.01); *H03J 2200/10* (2013.01); *H03L 2207/50* (2013.01)

(58) Field of Classification Search
CPC ..................................................... H03B 5/1265
USPC .................................. 331/167, 117 R, 117 FE
See application file for complete search history.

(56) References Cited

U.S. PATENT DOCUMENTS

| | | | | |
|---|---|---|---|---|
| 7,245,190 B2* | 7/2007 | Copani | ................ | H03B 5/1231 331/117 R |
| 2008/0174378 A1* | 7/2008 | Cusmai | .................. | H03B 27/00 331/167 |
| 2008/0284534 A1* | 11/2008 | El Rai | ...................... | H03B 5/02 331/117 FE |

OTHER PUBLICATIONS

Andreani, P. et al., "A TX VCO for WCDMA/EDGE in 90 nm RF CMOS", IEEE J. Solid-State Circ., vol. 46, No. 7, pp. 1618-1626, Jul. 2011.

(Continued)

*Primary Examiner* — Joseph Chang
(74) *Attorney, Agent, or Firm* — Zaretsky Patent Group PC; Howard Zaretsky

(57) ABSTRACT

A novel and useful LC-tank digitally controlled oscillator (DCO) incorporating a split transformer configuration. The LC-tank oscillator exhibits a significant reduction in area such that it is comparable in size to conventional ring oscillators (ROs) while still retaining its salient features of excellent phase noise and low sensitivity to supply variations. The oscillator incorporates an ultra-compact split transformer topology that is less susceptible to common-mode electromagnetic interference than regular high-Q LC tanks which is highly desirable in SoC environments. The oscillator, together with a novel dc-coupled buffer, can be incorporated within a wide range of circuit applications, including clock generators and an all-digital phase-locked loop (ADPLL) intended for wireline applications.

20 Claims, 11 Drawing Sheets

(51) Int. Cl.
  *G04F 10/00* (2006.01)
  *H03L 7/08* (2006.01)
  *H03M 1/00* (2006.01)
  *H03L 7/093* (2006.01)
  *H03M 1/20* (2006.01)
  *H03L 7/089* (2006.01)
  *H03L 7/197* (2006.01)
  *H03K 3/03* (2006.01)

(56) References Cited

OTHER PUBLICATIONS

Babaie, M. et al., "A Class-F CMOS Oscillator", IEEE J. Solid-State Circ., vol. 48, No. 12, pp. 3120-3133, Dec. 2013.
Borremans J. et al., "A Single-Inductor Dual-Band VCO in a 0.06mm2 5.6GHz Multi-Band Front-End in 90nm Digital CMOS", ISSCC 2008, pp. 324-325, Feb. 2008.
Fanori, L. et al., "A 2.4-to-5.3GHz Dual-Core CMOS VCO with Concentric 8-Shaped Coils", ISSCC 2014, pp. 370-371, Feb. 2014.
Ham, D. et al., "Concepts and Methods in Optimization of Integrated LC VCOs", IEEE J. Solid-State Circ., vol. 36, No. 5, pp. 896-909, Jun. 2001.
Hwang, I. C. et al., "A CMOS Self-Regulating VCO With Low Supply Sensitivity", IEEE J. Solid-State Circ., vol. 39, No. 1, pp. 42-48, Jan. 2004.
Levantino, S. et al., "Frequency dependence on bias current in 5 GHz CMOS VCOs: impact on tuning range and flicker noise upconversion", JSSC, vol. 37, No. 8, pp. 1003-1011, Aug 2002.
Li, G. et al., "A Low-Phase-Noise Wide-Tuning-Range Oscillator Based on Resonant Mode Switching", IEEE J. Solid-State Circ., vol. 47, No. 6, pp. 1295-1308, Jun 2012.
Mazzanti, A. et al., "Class-C Harmonic CMOS VCOs, With a General Result on Phase Noise", IEEE J. Solid-State Circ., vol. 43, No. 12, pp. 2716-2729, Dec. 2008.
Safarian, Z. et al., "A 1.3-6 GHz Triple-Mode CMOS VCO Using Coupled Inductors", IEEE 2008 Custom Intg. Circ. Conf. (CICC), pp. 69-72, 2008.
Yim, S. M. et al., "Switched Resonators and Their Applications in a Dual-Band Monolithic CMOS LC-Tuned VCO", IEEE Trans. Microwave Theory, vol. 54, No. 1, pp. 74-81, Jan. 2006.
Soltanian, B. et al., "An Ultra-Compact Differentially Tuned 6-GHz CMOS LC-VCO With Dynamic Common-Mode Feedback", IEEE J. Solid-State Circ., vol. 42, No. 8, pp. 1635-1641, Aug. 2007.
Tanabe, A. et al., "A Low-Power, Small Area Quadrature LC-VCO using miniature 3D Solenoid shaped Inductor", RFIC 2009, pp. 263-266, 2009.
Tanabe, A. et al.,"A Novel Variable Inductor Using a Bridge Circuit and Its Application to a 5-20 GHz Tunable LC-VCO", IEEE J Solid-State Circ, vol. 46, No. 4, pp. 883-893, Apr. 2011.
Toso, S.D. et al., "A 0.06 mm2 11 mW Local Oscillator for the GSM Standard in 65 nm CMOS", IEEE J. Solid-State Circ., vol. 45. No. 7, pp. 1295-1304, Jul. 2010.
Zheng, S. et al., "A 4.1-to-6.5GHz Transformer-Coupled CMOS Quadrature Digitally-Controlled Oscillator with Quantization Noise Suppression", RFIC 2012, pp. 519-522, 2012.

* cited by examiner

SPLIT TRANSFORMER BASED LC-TANK DIGITALLY CONTROLLED OSCILLATOR

REFERENCE TO PRIORITY APPLICATION

This application claims priority to U.S. Provisional Application Ser. No. 62/039,481, filed Aug. 20, 2014, entitled "Low-Q Transformer-Based Oscillator," incorporated herein by reference in its entirety.

FIELD OF THE INVENTION

The present invention relates generally to oscillator circuits and in particular to an LC tank based digitally controlled oscillator (DCO) having a split transformer configuration.

BACKGROUND OF THE INVENTION

Monolithic frequency synthesizers are well known and have been used as key building blocks in a wide range of applications. In communications, they generate a GHz level frequency carrier either through an inductor-capacitor (LC)-tank oscillator or a ring oscillator (RO), depending on the application's set of requirements and integrated circuit (IC) implementation tradeoffs.

Ring oscillators typically occupy a small silicon area and offer wide tuning range, thus making them flexible and inexpensive at any CMOS node, which is highly desirable in wireline systems. Their intrinsically poor phase noise (PN) and high sensitivity to supply voltage variations (i.e. frequency pushing), however, limit their use and often require either very complex calibration or high power-supply ripple rejection ratio (PSRR) low drop out regulators (LDOs) that employ large capacitors, thus effectively reducing their area advantage.

On the other hand, LC-tank oscillators inherently feature much lower phase noise and frequency pushing. Their power efficiency is superior due to a high quality (Q)-factor of their inductor. The frequency pushing is mostly related to a voltage dependence of their active devices' parasitic capacitances. Some classes of LC-tank oscillators, such as class-F or class-C, with an inductor or a transformer, exhibit small frequency pushing since their active devices require biasing networks of zero dc current, thus promoting effective filtering of dynamic variations (i.e. noise, ripple) on the supply line $V_{DD}$.

Drawbacks of LC-tank oscillators, however, include (1) their large size and (2) narrow tuning range. There are a few cases in prior art literature where small inductors were designed (1) by stacking metal layers in a vertical solenoid fashion or (2) by plenary shrinking the inductor. In the former case, the area obtained was extremely small, but its tuning range of only 5-10% was impractical in the face of process variations. In the latter case, the large number of turns caused the inductor to be very sensitive to its surroundings, requiring the same techniques used for large inductors to avoid Q-factor deterioration, such as complete inductor isolation, which is not permitted anymore in advanced technologies.

Although wide tuning range can be achieved with high-Q oscillators, as in dual mode, similar techniques employed to conventional LC-tank oscillators impose severe constrains on area and, consequently, coupling to nearby circuits. A switched-inductor topology has been proposed which was possible due to a combination with a pair of analog varactors as coarse/fine tuning banks, but with extremely high sensitivity (worst case on the order of 2.5 GHz/V), requiring a very stable control voltage (and thus a large capacitor) that would reduce any size advantage.

Based on the above observations of prior art attempts at compact oscillators, the desired oscillator would combine superior PN and frequency pushing of an LC-tank oscillator with low area and wide tuning range (i.e. 2:1 tuning range is required to generate an arbitrarily lower frequency through an integer division) of an RO. Furthermore, to exploit the scaling of CMOS technology, a digital manner of frequency tuning would be desired.

SUMMARY OF THE INVENTION

The present invention is an LC-tank oscillator incorporating a split transformer configuration. The LC-tank oscillator exhibits a significant reduction in area such that it is comparable in size to conventional ring oscillators (ROs) while still retaining its salient features of excellent phase noise and low sensitivity to supply variations. The oscillator incorporates an ultra-compact split transformer topology that is less susceptible to common-mode electromagnetic interference than regular high-Q LC tanks which is highly desirable in SoC environments. The oscillator, together with a novel dc-coupled buffer, can be incorporated within a wide range of circuit applications, including for example a conventional phase locked loop (PLL), all-digital phase-locked loop (AD-PLL), wireline transceiver circuits and mobile devices.

There is therefore provided in accordance with the invention, an oscillator comprising a passive LC-tank circuit having an input and an output, an active circuit coupled to the passive circuit, the active circuit having an input coupled to the output of the passive circuit and an output coupled to the input of the passive circuit, the passive circuit comprising a split transformer whose primary windings are coupled between the active circuit outputs and whose secondary windings are coupled between the active circuit inputs, and wherein the split transformer is configured so as to substantially cancel their respective magnetic fields.

There is also provided in accordance with the invention, an oscillator comprising a passive LC-tank circuit having an input and an output, an active circuit coupled to the passive circuit, the active circuit having an input coupled to the output of the passive circuit and an output coupled to the input of the passive circuit, and the passive circuit comprising a split transformer having first and second independent single ended transformers each having a primary winding and a secondary winding, the primary windings of the first and second transformers coupled between a supply and a respective active circuit output, the secondary windings of the first and second transformers coupled between a bias voltage and a respective active circuit input.

There further therefore provided in accordance with the invention, a digitally controlled oscillator (DCO), comprising a semiconductor substrate, a passive LC-tank circuit having an input and an output, an active circuit coupled to the passive circuit, the active circuit having an input coupled to the output of the passive circuit and an output coupled to the input of the passive circuit, the passive circuit comprising a split transformer having first and second independent single ended transformers each having a primary winding and a secondary winding, the primary windings of the first and second transformers coupled between supply and a respective active circuit output, the secondary windings of the first and second transformers coupled between a bias voltage and a respective active circuit input, a plurality of digitally controlled switched capacitor banks divided between the primary and secondary windings of the first and second transformers, the plurality of switched capacitor banks operative to provide frequency tuning of the DCO, wherein the first and second transformers are situated symmetrically to each other on the substrate such that their respective magnetic fields substantially cancel each other out thereby improving isolation of the DCO.

BRIEF DESCRIPTION OF THE DRAWINGS

The invention is herein described, by way of example only, with reference to the accompanying drawings, wherein.

DETAILED DESCRIPTION OF THE INVENTION

The present invention provides an LC-tank oscillator incorporating a split transformer configuration. The LC-tank oscillator exhibits a significant reduction in area such that it is comparable in size to conventional ring oscillators (ROs) while still retaining its salient features of excellent phase noise and low sensitivity to supply variations. The oscillator incorporates an ultra-compact split transformer topology that is less susceptible to common-mode electromagnetic interference than regular high-Q LC tanks, which is highly desirable in SoC environments. The oscillator, together with a novel dc-coupled buffer, can be incorporated within a wide range of circuit applications, including for example a conventional phase locked loop (PLL), all-digital phase-locked loop (ADPLL), wireline transceiver circuits and mobile devices. Note that throughout this document the term split transformer is meant to mean two independent transformers and not a center tapped transformer or other single transformer configurations.

The oscillator of the present invention combines superior PN and frequency pushing of an LC-tank oscillator with the low area and wide tuning range of an RO. Furthermore, to exploit the scaling of CMOS technology, digital frequency tuning is provided. An example transformer-based digitally controlled oscillator (DCO) constructed by the inventors achieved a 20 dB figure-of-merit (FoM) improvement over prior art ROs. FoM is a quality measure of oscillators taking into account the free-running phase noise (PN), power consumption $P_{DC}$ and operating frequency ($f_0$) and is given by the following.

$$FoM = |PN| + 20 \cdot \log_{10}\left(\frac{f_0}{\Delta f}\right) - 10 \cdot \log_{10}\left(\frac{P_{DC}}{1\text{ mW}}\right) \quad (1)$$

$FoM_T$ given by the equation below further includes the tuning range (TR).

$$FoM_T = FoM + 20 \cdot \log_{10}\left(\frac{TR[\%]}{10}\right) \quad (2)$$

An example application of the transformer-based DCO of the present invention in an ADPLL circuit is provided infra. The transformer-based DCO, along with a novel dc-coupled output buffer, provides 23 dB better $FoM_T$ than a conventional RO based circuit with the same area (120×120 µm²), while offering wide tuning range, robustness to supply variations and far-field cancellation.

Figure 1:
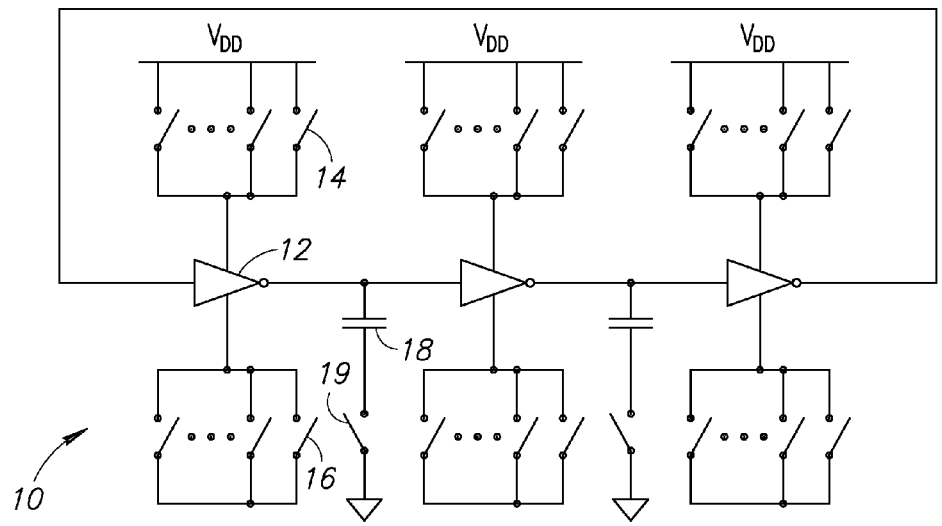
FIG. 1 is a high level schematic diagram illustrating an example inverter ring oscillator of the present invention.

A high level schematic diagram illustrating an example ring oscillator (RO) of the present invention is shown in FIG. 1. The single-ended or non-differential RO circuit, generally referenced 10, comprises an odd plurality of inverters 12. Each inverter has associated with it a series of switches (of varying resistance or strength) 14 to $V_{DD}$, switches (of varying resistance or strength) 16 to ground and one or more switched 19 capacitors 18. The switches 14, 16 and switched capacitors 18 all contribute to the frequency tuning of the RO.

In one embodiment, the RO is implemented as 3-stage current-starved topology shown in FIG. 1. The frequency tuning is performed exclusively by digital controls with very coarse steps (i e tuning band) provided by switching the switches 14 and 16 (or alternatively transistors acting as current sources) and finer frequency steps by single-ended switched capacitors. The capacitors are divided between 4-bit binary-weighted coarse, 30-bit unit-weighted mid-coarse and 15-bit unit-weighted fine banks. Also, a 3-bit unit-weighted bank for second order MASH ΣΔ dithering is implemented to enhance frequency resolution.

To ensure the circuit symmetry and balance, the coarse and mid-coarse banks are switched at the same time at all three DCO phases. For the fine bank and the ΣΔ dithering capacitors, the control is applied to only one of the DCO phases at a time in a thermometer manner so a finer resolution is achieved with monotonic frequency steps. All capacitors are based on a unit cell with an nMOS switch and a metal-oxide-metal (MOM) capacitor that are combined in groups according to the desired bank capacitance. Moreover, the RO uses a single-ended topology since it provides better FoM when compared to its counterpart (pseudo-) differential topology.

As described supra, ring oscillators typically occupy a small silicon area and offer wide tuning range, thus making them flexible and inexpensive at any CMOS node, which is highly desirable in wireline systems. Their intrinsically poor phase noise (PN) and high sensitivity to supply voltage variations (i.e. frequency pushing), however, limit their use and often require either very complex calibration or high power-supply ripple rejection ratio (PSRR) low drop out regulators (LDOs) that employ large capacitors, thus effectively reducing their area advantage.

Figure 2A:
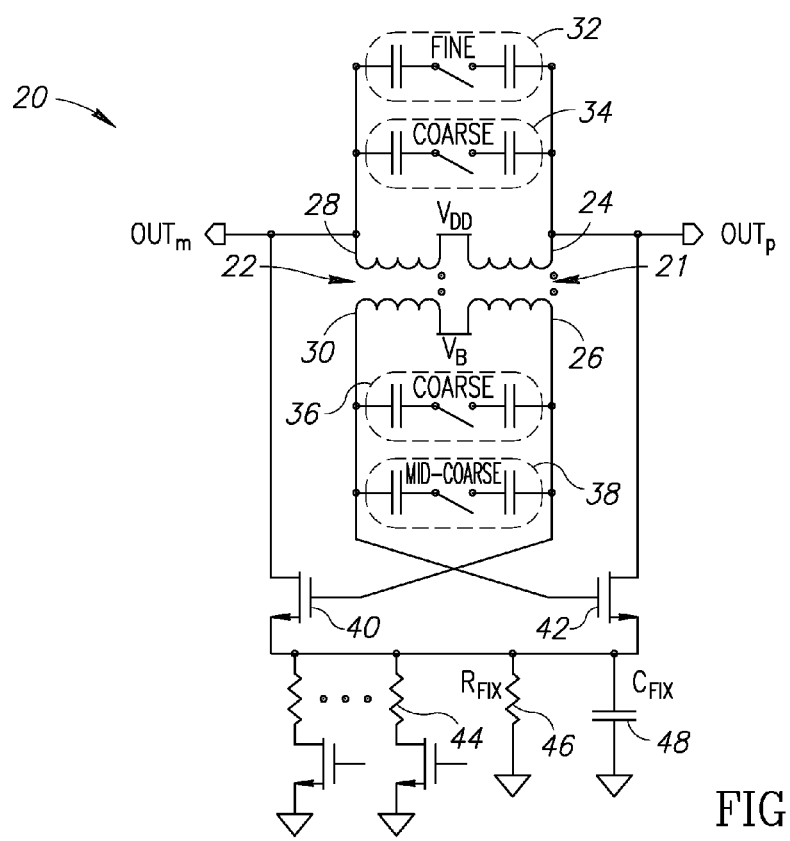
FIG. 2A is a schematic diagram illustrating an example split transformer based oscillator of the present invention.
Figure 2B:
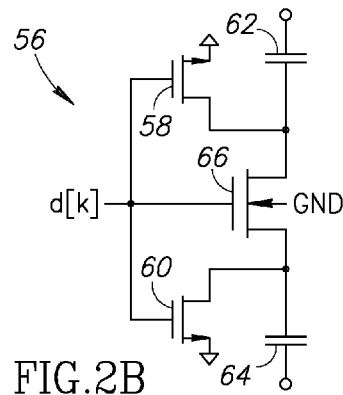
FIG. 2B is a schematic diagram illustrating an example switched capacitor unit.
Figure 2C:
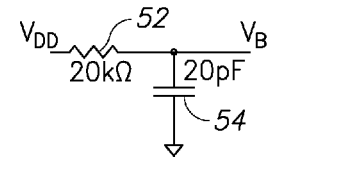
FIG. 2C is a schematic diagram illustrating example $V_B$ filter.

A schematic diagram illustrating an example split transformer based digitally controlled oscillator (DCO) of the present invention is shown in FIG. 2A. A schematic diagram illustrating an example switched capacitor unit is shown in FIG. 2B. A schematic diagram illustrating example $V_B$ filter is shown in FIG. 2C. The DCO circuit, generally referenced 20, comprises an active transistor pair 40, 42, having an input (i.e. transistor gate terminals) and output (i.e. drain terminals), cross coupled to a passive LC-tank circuit including split transformers 21, 22 and a plurality of digitally controlled switched capacitor banks 32, 34, 36, 38 providing a frequency tuning function for the DCO. Transformer 21 comprises primary winding 24 (i.e. input) connected between the drain of transistor 42 and $V_{DD}$ and secondary winding 26 (i.e. output) coupled between the gate of transistor 40 and $V_B$. Transformer 22 comprises primary winding 28 (i.e. input) connected between the drain of transistor 40 (i.e. output) and $V_{DD}$ and secondary winding 30 coupled between the gate of transistor 42 and $V_B$.

The low Q-factor transformer based DCO comprises two small form-factor transformers split into two single ended transformers. In one embodiment, the Q factor of the transformer is about 8-10. The capacitor banks are configured depending on the desired frequency tuning range. Capacitor banks are provided for frequency acquisition, tracking and compensating for PVT variations. The acquisition capacitor banks include unit weighted digital control and, in one embodiment, are only applied to the transformer secondary windings. The tracking capacitor banks include unit weighted digital control and, in one embodiment, are qualitatively identical to the acquisition bank and are only applied to the transformer primary windings.

The switched capacitor unit, generally referenced 56, comprises auxiliary transistor switches 58, 60, main transistor switch 66 and capacitors 62, 64. The RC filter circuit, generally referenced 50, comprises resistor 52 and capacitor 54 that form a low pass filter having a cutoff frequency $f_{-3dB}$ of approximately 400 kHz.

Typically, scaling down an inductive element is very challenging. It requires multiple optimizations to deliver the salient features of an RO, such as wide tuning range and small area, while keeping high power efficiency (i.e. better PN with less power). The goal is to squeeze a sufficient inductance in a small area without drastically degrading the Q-factor. In addition, the parasitic capacitance is preferably kept low which infers high self-resonance frequency (SRF) so that the desired tuning range can be achieved and at the same time meet stringent metal density requirements.

The large size of high-Q inductors inevitably makes them very sensitive to their surroundings since they act like antennas. By either picking up noise or inducing currents in nearby circuits these inductors could potentially lead to various operational issues such as frequency pulling of two or more close-by oscillators or noise induction in analog circuits which would require special countermeasures. Maintaining the inductor isolation and space between the circuits is expensive due to extra silicon and is not always possible due to stringent metal density rules.

Figure 3:
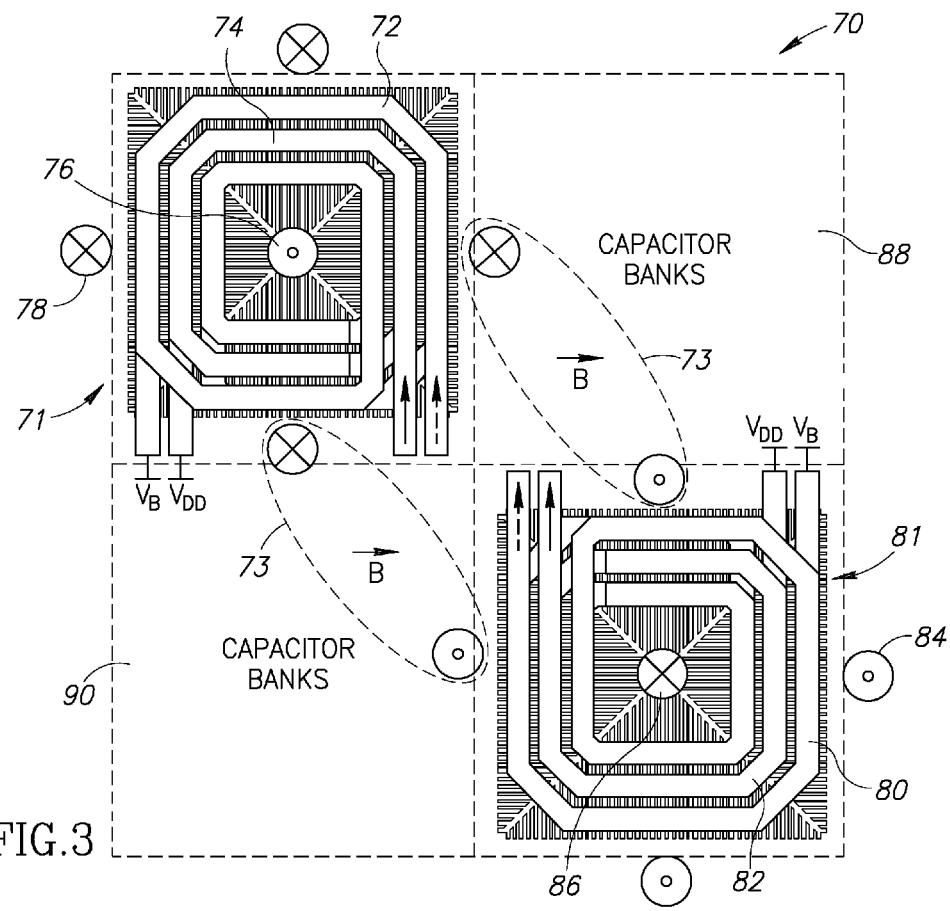
FIG. 3 is a top down view illustrating the layout of the oscillator transformer and capacitor bank and the cancellation of the magnetic fields.
Figure 4:
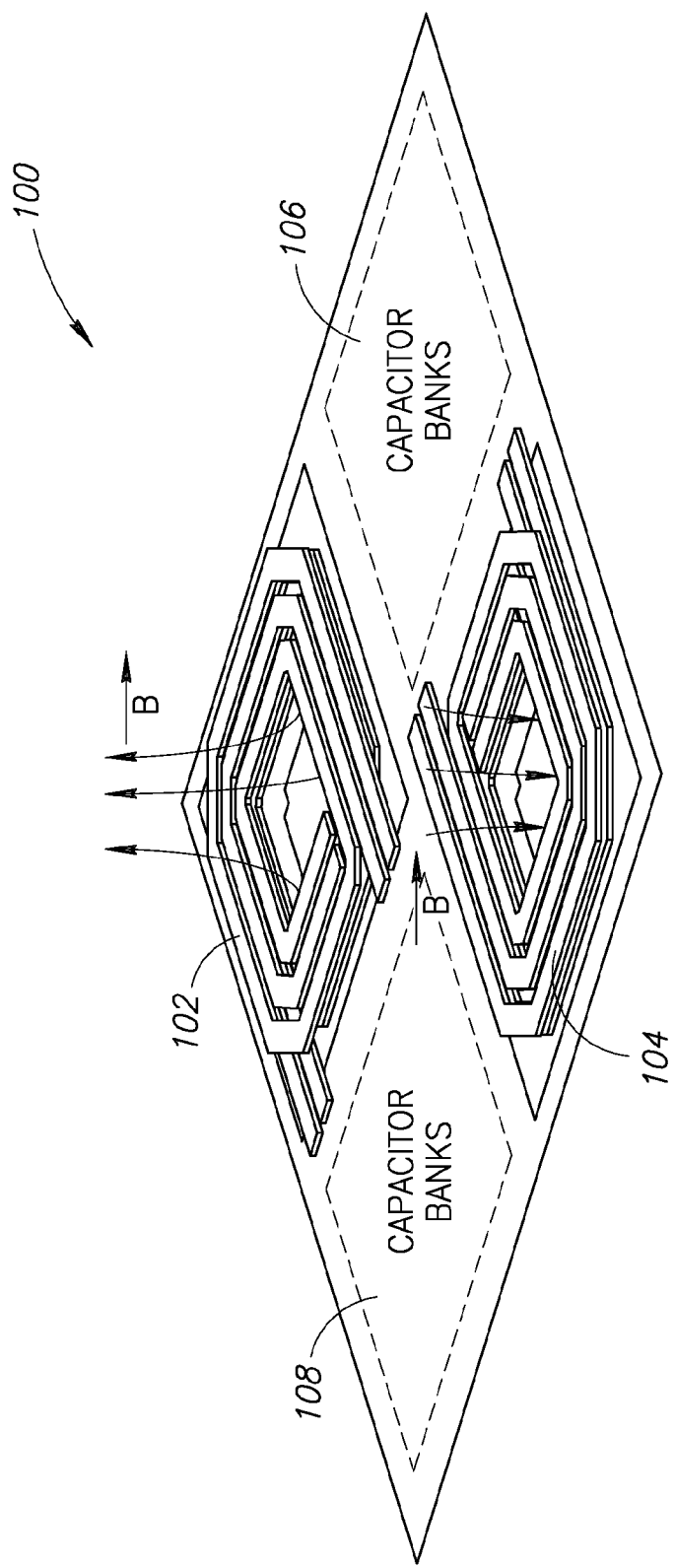
FIG. 4 is a perspective view illustrating layout of the oscillator transformer and capacitor bank and the cancellation of the magnetic fields.

A top down view illustrating the layout of the oscillator transformer and capacitor bank and the cancellation of the magnetic fields is shown in FIG. 3. In one embodiment, the LC-tank circuit, generally referenced 70, comprises a first half 71 of the split transformer having a turns ratio of 1:2 and associated capacitor bank 88 and a second half 81 of the split transformer and associated capacitor bank 90. The first half 71 of the transformer comprises primary winding 74 and secondary winding 72. Dot 76 indicates the magnetic field $\vec{B}$ projecting out of the figure while crosses 78 show the field going into the figure. The second half 81 of the transformer comprises primary winding 82 and secondary winding 80. Dots 84 indicates the magnetic field $\vec{B}$ projecting out of the figure while cross 86 show the field going into the figure. A perspective view illustrating layout of the oscillator transformer and capacitor bank and the cancellation of the magnetic fields is shown in FIG. 4. In this example embodiment, the chip area of the LC-tank circuit including split transformer windings 102, 104 and corresponding capacitor banks 106, 108 takes up 120×120 $\mu m^2$.

One technique to deal with the strong magnetic fields from large inductors is to use octagonal shaped inductors, which provides field cancellation. For compact oscillators, however, more elaborate structures are required which restricts the beneficial use of transformers. In the split topology of the present invention, shown in FIGS. 3 and 4, the magnetic fields $\vec{B}$ generated by the transformer windings are in opposite direction to each other, according to the injected current (in this example embodiment they are differential), either in the inner or outer coils, with a slightly different magnitude. Moreover, due to their small size, the destructive effect of the magnetic field inside the coils is negligible, keeping the Q-factor and inductance unchanged. For their surroundings, however, the reminiscent B fields have opposite phases and are largely canceled out (see 73 in FIG. 3).

In order to quantify the magnetic interaction of the inductors with their surroundings, we can analyze the coupling factor $k_m$ between the inductors and another (imaginary test) coil, which is in this case single-turn. This approach quantifies the relative disturbance in relation to a distance from the center. The single-turn coil is used to average out the electromagnetic coupling at a certain distance d. Note that here the electric field also plays a role, due to capacitive interaction. The structure of the split transformer achieves relatively small size thereby minimizing the overall magnetic field. The placement of the two individual transformers causes the magnetic far fields to cancel out (see 73 in FIG. 3). This lowers the electromagnetic interference (EMI) and improves the electromagnetic compatibility (EMC) with highly dense SoCs.

Figure 5:
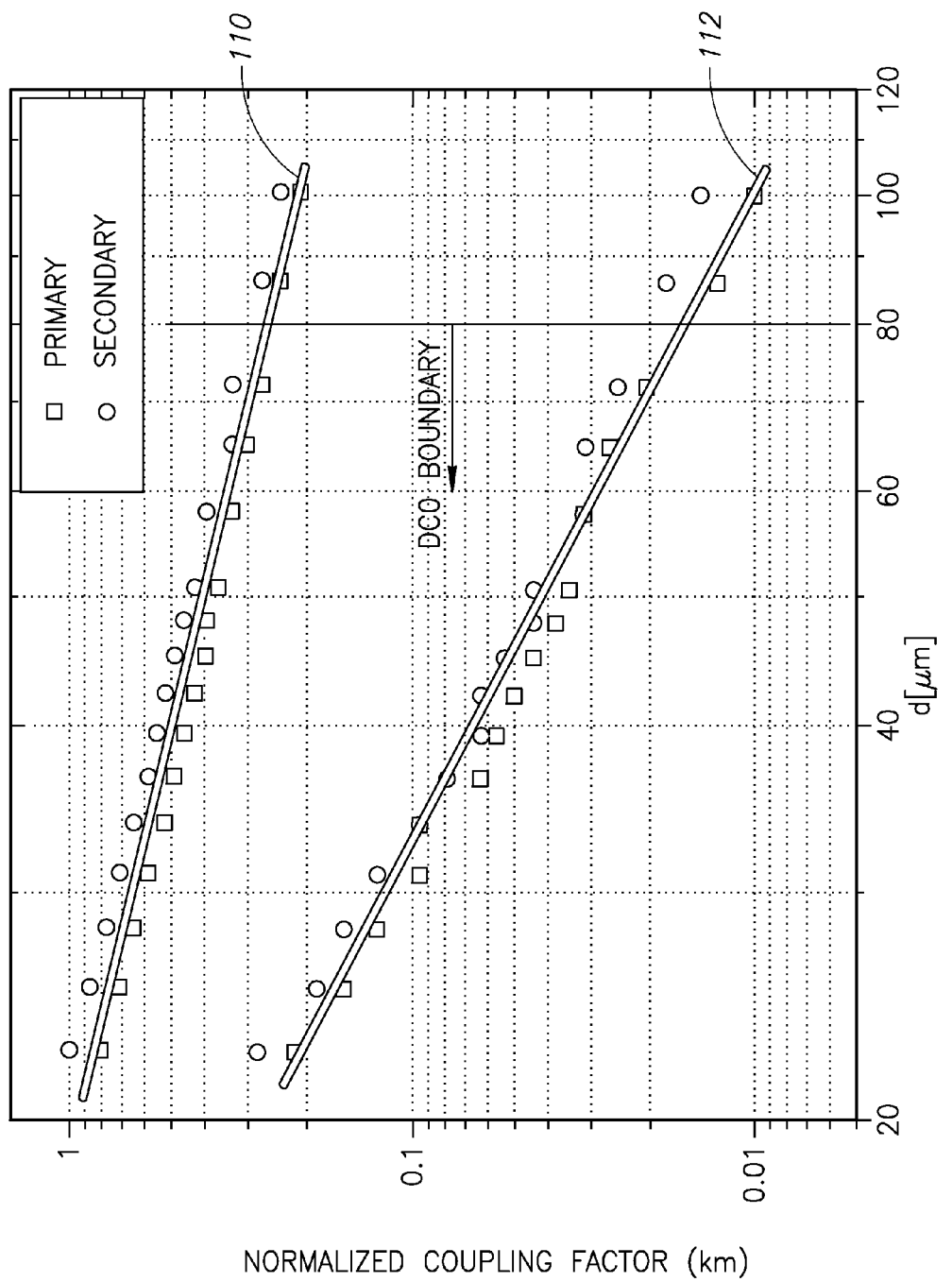
FIG. 5 is a graph illustrating the simulated coupling factor for a typical inductor.

FIG. 5 shows the normalized $k_m$ between inner and outer inductors to the single-turn test coil, in the direction θ of 45 degrees. When properly driven, i.e. differentially, it provides magnetic field cancellation, as expected. For comparison, the same structure was stimulated in a single-ended way, meaning that the magnetic fields of both coils have the same phase, exactly how we would expect from a typical inductor. The efficiency of the field cancellation can be shown first by the coupling magnitude, which is 75% smaller at the edge of the DCO structure and then rapidly decaying. The coupling factor between a typical inductor to another coil drops in proportion to $1/d^2$ as shown in line 110 where for the DCO of the present invention it drops in proportion to $1/d^3$ as shown in line 112, in accordance with the well-known theory of dipoles.

Moreover, the overall magnetic field is proportional to the size of the coil, so minimizing it helps to reduce sensitivity. Thus, by qualitatively analyzing the magnetic fields and the comparison shown in FIG. 5, we expect the circuit to be very robust to common-mode magnetic fields and thus suitable to System on Chip (SoC) environments.

Finally, the inner and outer coils can be combined into a single transformer. The inner coils serving as primary and the outer coils as secondary. This combination allows us to obtain a passive gain (due to the 1:2 turns ratio, in this example embodiment) in the LC tank that is important for operation of the oscillator.

For optimum performance of the oscillator, the split transformer of the present invention is preferably driven differentially. Various aspects of the active and LC-tank circuitry that forms the DCO will now be described in more detail.

The DCO of the present invention employs a transformer-based LC cross-coupled topology, with the ability to low-pass filter the gate-source bias voltage $V_{GS}$ of the active devices. This achieves a very low frequency pushing sensitivity by minimizing gate-source capacitance $C_{GS}$ modulation due to $V_{GS}$. The transformer-based digitally controlled oscillator (DCO) is shown in FIG. 2A. In one embodiment, the transformer comprises two independent multi-turn single-ended transformers 21, 22, using top-layer metal conductors (with a thickness of 0.85 µm), in a digital 40 nm CMOS technology without ultra-thick metals, while satisfying all restricted metal density design rule check (DRC) requirements. The two independent transformers are placed symmetrically to the center of the DCO, in order to obtain magnetic field cancellation. The turns ratio (n=1:2) provides passive voltage gain between the drain and gate of the transconductor pair, thus reducing potential start-up problems.

In one embodiment, the design of the transformer includes pattern-ground shield in poly and 6 thin metals, and was simulated using the Method-of-Momentum. Each coil has a winding width of 2.9 µm and spacing of 1.15 µm, where the outer and inner diameters are 38.9 µm and 16.9 µm, respectively. The transformer has a coupling coefficient of 0.7, between the 350 pH primary and 1 nH secondary, peak quality factor of 8 around 13 GHz and self-resonance frequency (SRF) at 50 GHz.

The capacitor banks are divided between the primary and secondary of the transformer. The coarse banks (6-bit binary-weighted) 34, 36 are switched simultaneously enhancing the overall Q-factor of the transformer over individual inductors. Mid-coarse bank 38 and fine bank 32 are both 14-bit unit-weighted, but the effective capacitive weight of the former is $n^2$ (4 in this example embodiment) larger than the latter since the mid-coarse is connected only at the secondary and the fine bank is connected only at the primary. This is possible because in a transformer, having the primary as the reference side, the impedance of the secondary scales with $1/n^2$. Note that the slight asymmetry caused by that does not degrade the Q-factor of the entire tank circuit. Moreover, it can provide the required frequency range overlap as well as fine resolution.

In another embodiment, in order to improve the effective frequency resolution, second order multi-stage noise shaping (MASH) sigma-delta ($\Sigma\Delta$) dithering is applied to one or three unit-weighted bits of the fine bank. It uses a divided version of the output frequency (1/32 or 1/16) to dither capacitance of these one or three bits, effectively obtaining fractions of the minimum capacitance and consecutively finer frequency resolution.

Figure 6:
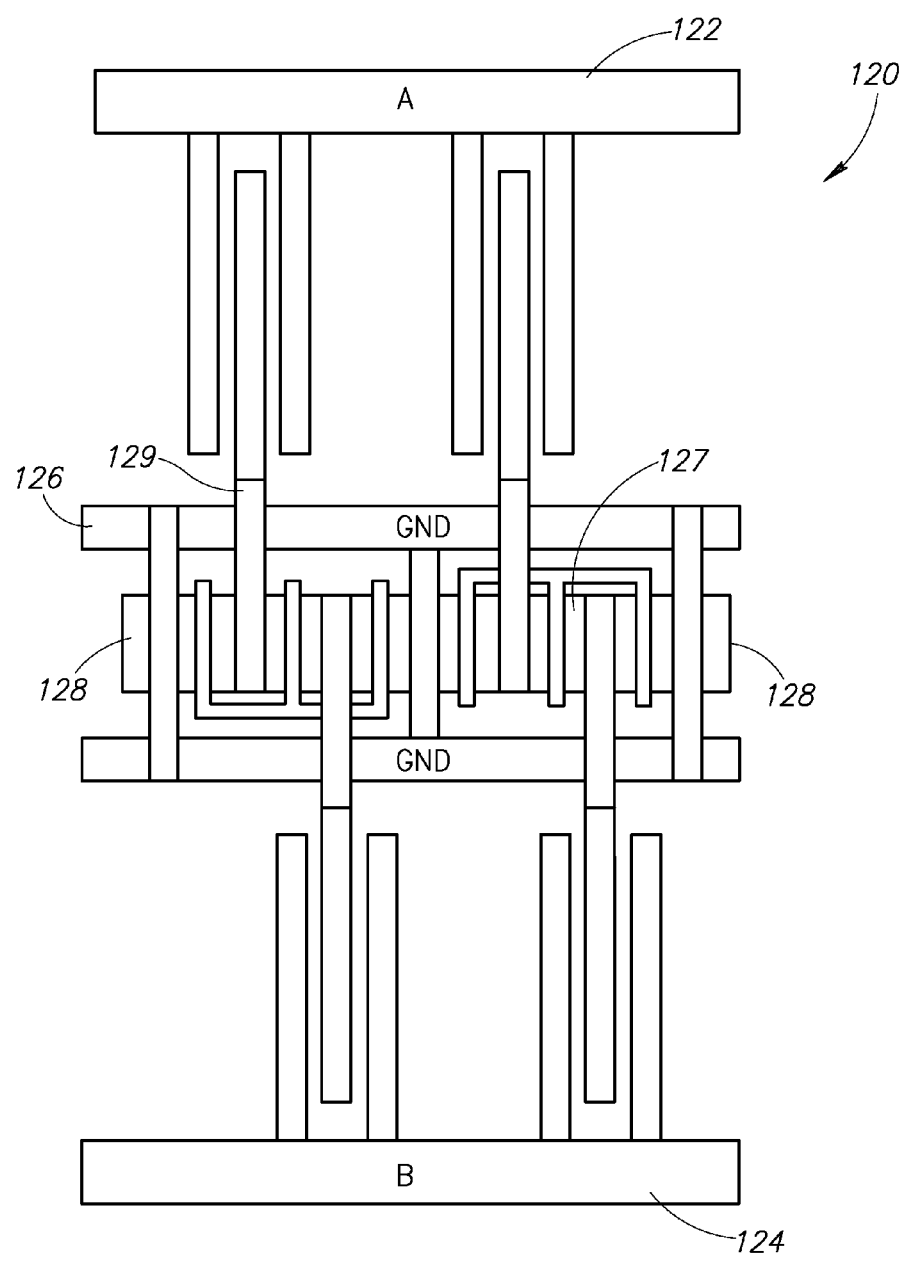
FIG. 6 is a diagram illustrating the capacitor bank of the oscillator in more detail.

The configuration of the switched capacitor units were described supra in connection with FIG. 2B, while the layout details are shown in FIG. 6. The layout, generally referenced 120, comprises a differential capacitor 122, 124 with a main switch 127 assisted by two auxiliary switches 128. The main switch 127 is responsible for turning the capacitors on/off. Without a dc level at its source and drain, however, it would not operate at its optimum. Thus, to help turn it on, two small transistors provide a path to ground. During the off-state, the leakage current to ground through the auxiliary switches provides a high impedance dc path to ground at the source and drain, preventing any direct bias condition for the corresponding pn junctions to the substrate. Note that the design of the capacitor bank effects the operation of the DCO, especially the connection between the switch 127 and the capacitors, since excessive parasitic capacitance in these lines, due to cross-coupling, affects the minimum $C_{OFF}$, thus reducing the tuning range. The capacitor bank $C_{ON}/C_{OFF}$ ratio is approximately three with a Q-factor greater than 12.

Besides the DCO optimization for the required PN and power consumption performance, another important circuit block is the first DCO output buffer. Non-linearity of the driven load (including the buffer non-linearity itself) and supply voltage disturbance could degrade the PN and, consequently, reduce the oscillator power efficiency. In addition, the continuing technology node shrink requires voltage supply reduction, while the transistor threshold voltage ($V_{th}$) is kept roughly the same, requiring new buffer topologies to overcome these issues.

The oscillator output has its resonating amplitude dependent on various PVT parameters and consumed current. The voltage waveform is centered around the supply level in this case, but it could center around ground or at any level in-between for other oscillator topologies. In one embodiment, the high frequency buffer is connected to the DCO through dc blockers (i.e. decoupling capacitors) allowing the buffer bias voltage to be set internally, reducing statistical process variation (especially pMOS and nMOS mismatches). These dc blockers, however, add extra load and area to the oscillator tank and depending on the frequency could be prohibitively large. Their internal dc biasing can also generate noise that can reversely feed into the oscillator. In another embodiment, the buffer is dc-coupled to the oscillator. A source-follower configuration uses dc coupling and exhibits wideband frequency response but often offers voltage gain well below unity.

Figure 7A:
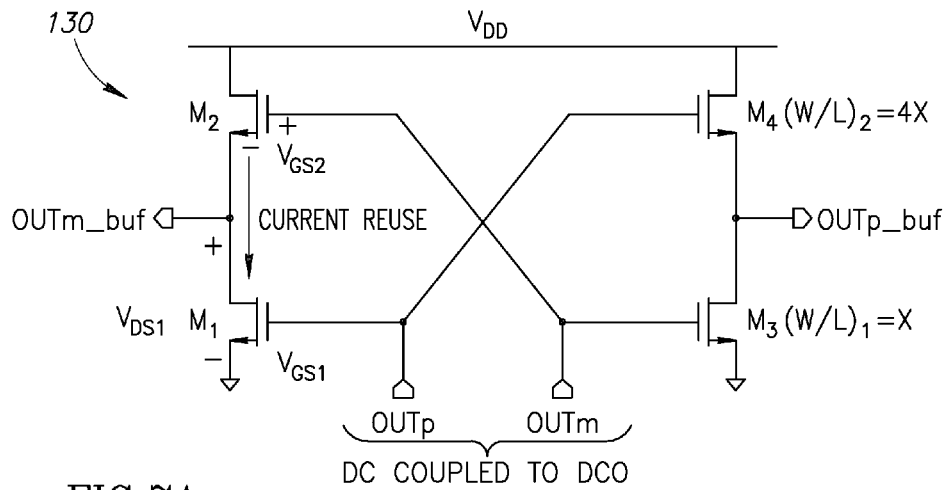
FIG. 7A is a schematic diagram illustrating a first stage of an example DC coupled low voltage oscillator output buffer circuit of the present invention.
Figure 7B:
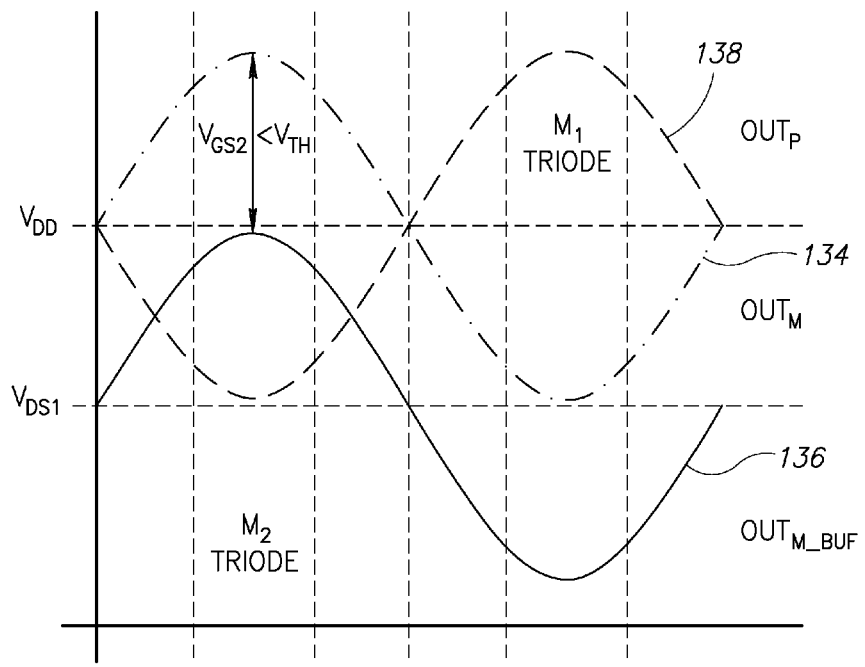
FIG. 7B is a graph illustrating the half circuit large signal excursion of the buffer of FIG. 7A.

In order to increase its power efficiency, the present invention provides a buffer having a combined source follower and common-source topology. A schematic diagram illustrating a first stage of an example DC coupled low voltage oscillator output buffer circuit of the present invention is shown in FIG. 7A. A graph illustrating the half circuit large signal excursion of the buffer of FIG. 7A is shown in FIG. 7B. A schematic diagram illustrating an example half circuit small signal simplified model of the output buffer of the present invention is shown in FIG. 7C.

In one embodiment, the buffer, generally referenced 130, is dc coupled to the DCO via inputs labeled $OUT_p$ and $OUT_m$, shares the same $V_{DD}$ supply voltage and uses only nMOS devices in order to reduce capacitive loading, noise and process mismatches, respectively. In an alternative embodiment, the buffer may use only pMOS devices which could correspond to a case of a pMOS based oscillator with an average value of the single ended oscillator waveform voltage around zero. The buffer comprises four transistors $M_1$, $M_2$, $M_3$ and $M_4$. Transistor pairs $M_1$ and $M_2$, and $M_3$ and $M_4$ are arranged in totem pole fashion. In this configuration, the nMOS transistors belonging to $M_1/M_2$ pair, as well as $M_3/M_4$ pair, are stacked between $V_{DD}$ and ground. The gates of $M_1$ and $M_4$ form one of the inputs connected to $OUT_p$ from the DCO. The gates of $M_2$ and $M_3$ form the other input that is connected to $OUT_m$ from the DCO. The drains of $M_2$ and $M_4$ are connected to $V_{DD}$ and the sources of $M_1$ and $M_3$ form are connected to ground. The source/drain connection of transistors $M_2$ and $M_1$, respectively, form one of the outputs $OUT_{m\_}$buf. The source/drain connection of transistors $M_4$ and $M_3$, respectively, form one of the outputs $OUT_{p\_}$buf.

From FIGS. 7A and 7B it can be seen that $V_{GS2}$ is kept constant and equal to $(V_{DD}-V_{DS1})$ which is chosen to be below the threshold voltage $(V_{th})$. In this manner, $M_2$ and $M_4$ operate in weak inversion and $M_1$ and $M_3$ operate in strong inversion since both share the same current and $M_2$ and $M_4$ are 4× larger than $M_1$ and $M_3$. For a short period of time, however, around 90 degrees and 270 degrees of the cycle, either one of the transistors enters the triode region (see traces 134, 136, 138) but that does not affect the overall performance since the other transistor is providing ac gain to the corresponding output. Also, due to a relatively small voltage swing (250 mV$_p$ in this embodiment), this linear region is reached only for a very short time. Thus, for the analysis, we can still treat the circuit using a small-signal model.

Figure 7C:
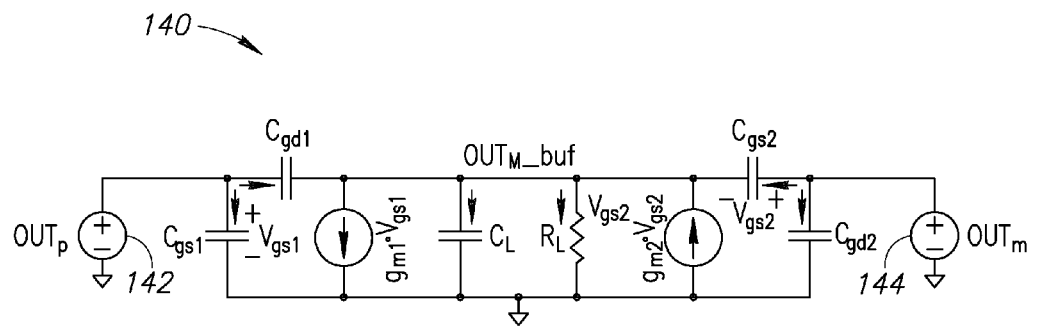
FIG. 7C is a schematic diagram illustrating an example half circuit small signal simplified model of the output buffer of the present invention.

FIG. 7C illustrates the small-signal simplified model of the left half of the circuit of FIG. 7A. The current reuse is represented by the inclusion of $gm_1$ in the gain. The circuit architecture provides compensation for the gate-source capacitance of $M_2$ ($C_{gs2}$), contributing to an overall voltage gain enhancement of 20% in this example embodiment, when compared to a simple source follower. The voltage gain enhancement, however, depends on the driven load where the differential overall gain is given by:

$$A_v = \frac{gm_1 + gm_2 + s(C_{gs2} - C_{gd1})}{gm_2 + 1/Z_L + s(C_{gs2} - C_{gd1})} \quad (3)$$

where $Z_L$ is the parallel association of the output impedance of the transistors (both output resistance and capacitance) with the load. The buffer output impedance is given by the following:

$$Z_{out} = \left(\frac{1}{Z_L} + \frac{gm_1 C_{gd1}}{C_{gd1} + C_{gs1}} + \frac{gm_2 C_{gs2}}{C_{gd2} + C_{gs2}}\right)^{-1} \quad (4)$$

In one embodiment, the transformer based DCO is packed in a square of 120×120 μm², including the transformer, capacitor banks, active core, output buffer and decoupling capacitors. Note that current process technology has very stringent manufacturing rules that must be followed. Previously, metal density over larger inductors could be waived with the designer taking responsibility. Today, however, one side of the die might affect the other and semiconductor foundries are reluctant to permit it. The problem is that high-Q inductors depend on the metal emptiness around them to perform well and this is a main challenge for RF circuit designers with future technologies. Thus, one advantage of keeping the inductor (or transformer in the DCO of the present invention) small is that any metal density requirements are easier to fulfill. Another advantage is that the magnetic field is kept mostly around the windings of the transformer, which contributes to lower interference on its surroundings. Further, the split transformer architecture of the invention reduces even more the far-field through field cancellation thus isolating the DCO from the environment.

Figure 8:
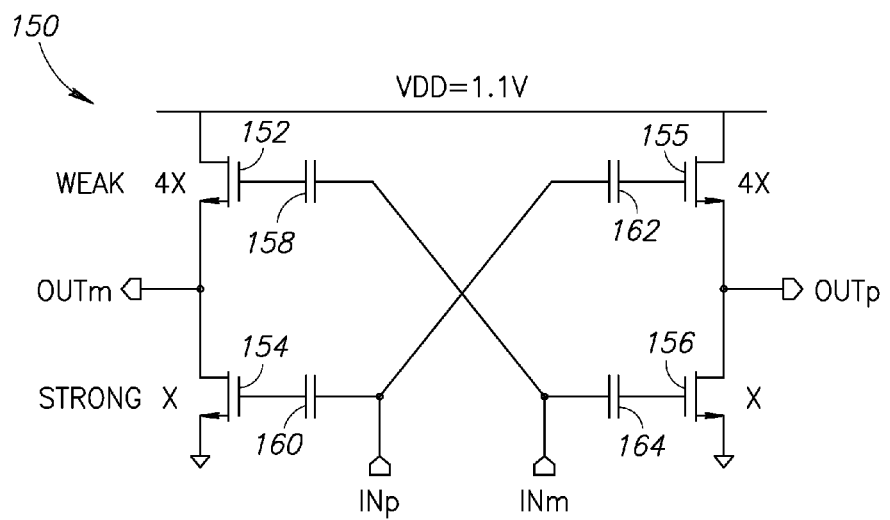
FIG. 8 is a schematic diagram illustrating a second stage of an example DC coupled low voltage oscillator output buffer circuit of the present invention.

A schematic diagram illustrating a second stage of an example DC coupled low voltage oscillator output buffer circuit of the present invention is shown in FIG. 8. The buffer circuit, generally referenced 150, comprises differential input terminal $IN_p$ coupled to transistors 154, 155 via capacitors 160, 162, respectively, and input terminal $IN_m$ coupled to transistors 152, 156 via capacitors 158, 164, respectively.

Several applications of the DCO of the present invention as a frequency generator will now be described.

Figure 9:
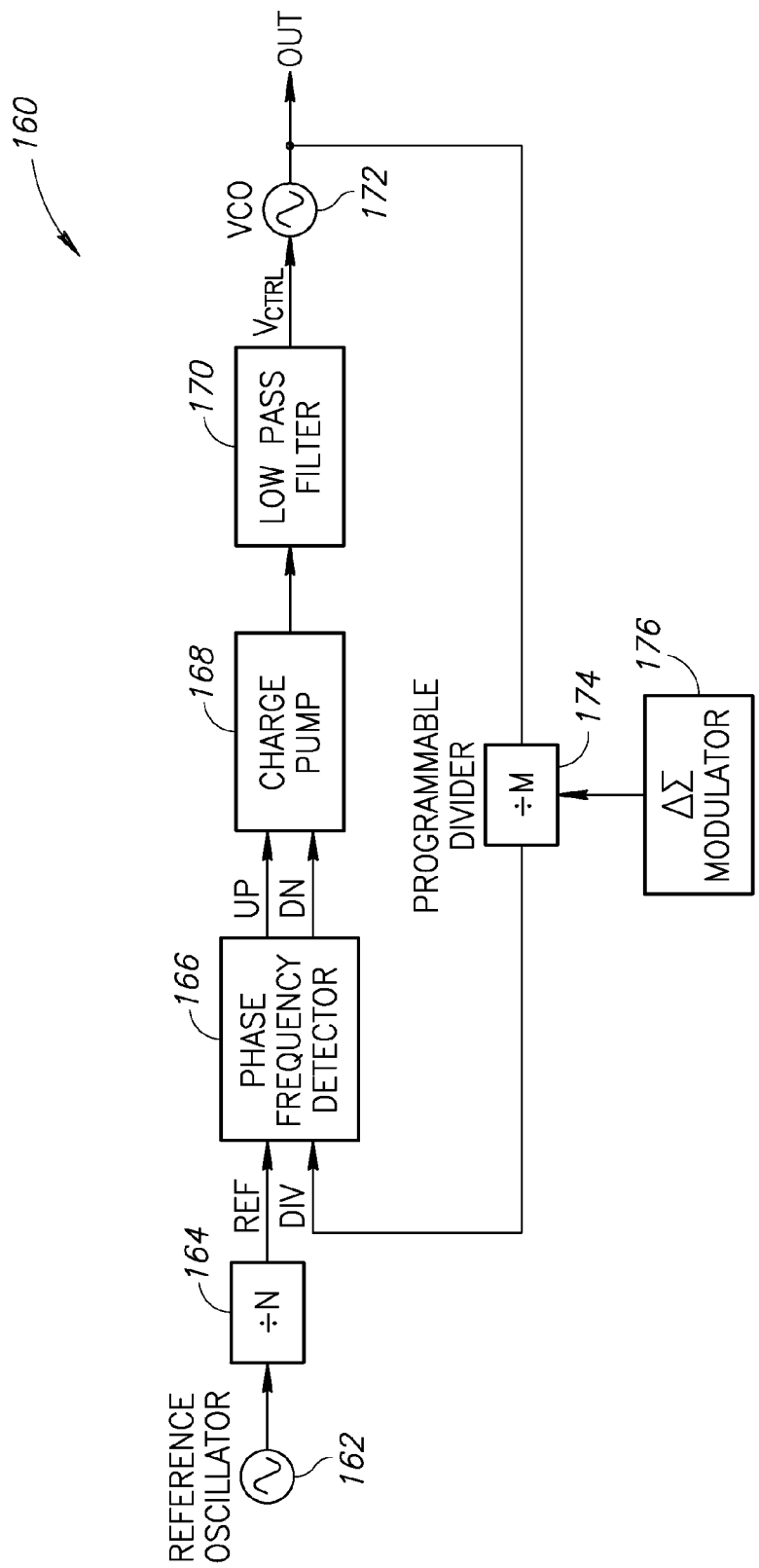
FIG. 9 is a block diagram illustrating an example phase locked loop incorporating the oscillator of the present invention.

A block diagram illustrating an example phase locked loop (PLL) incorporating the oscillator of the present invention is shown in FIG. 9. The PLL, generally referenced 160, comprises a reference oscillator 162, ÷N divider 164, phase/frequency detector 166, charge pump 168, low pass filter 170, voltage controlled oscillator (VCO) 172 incorporating the oscillator of the present invention, programmable ÷M divider 174 and ΣΔ modulator 176.

Figure 10:
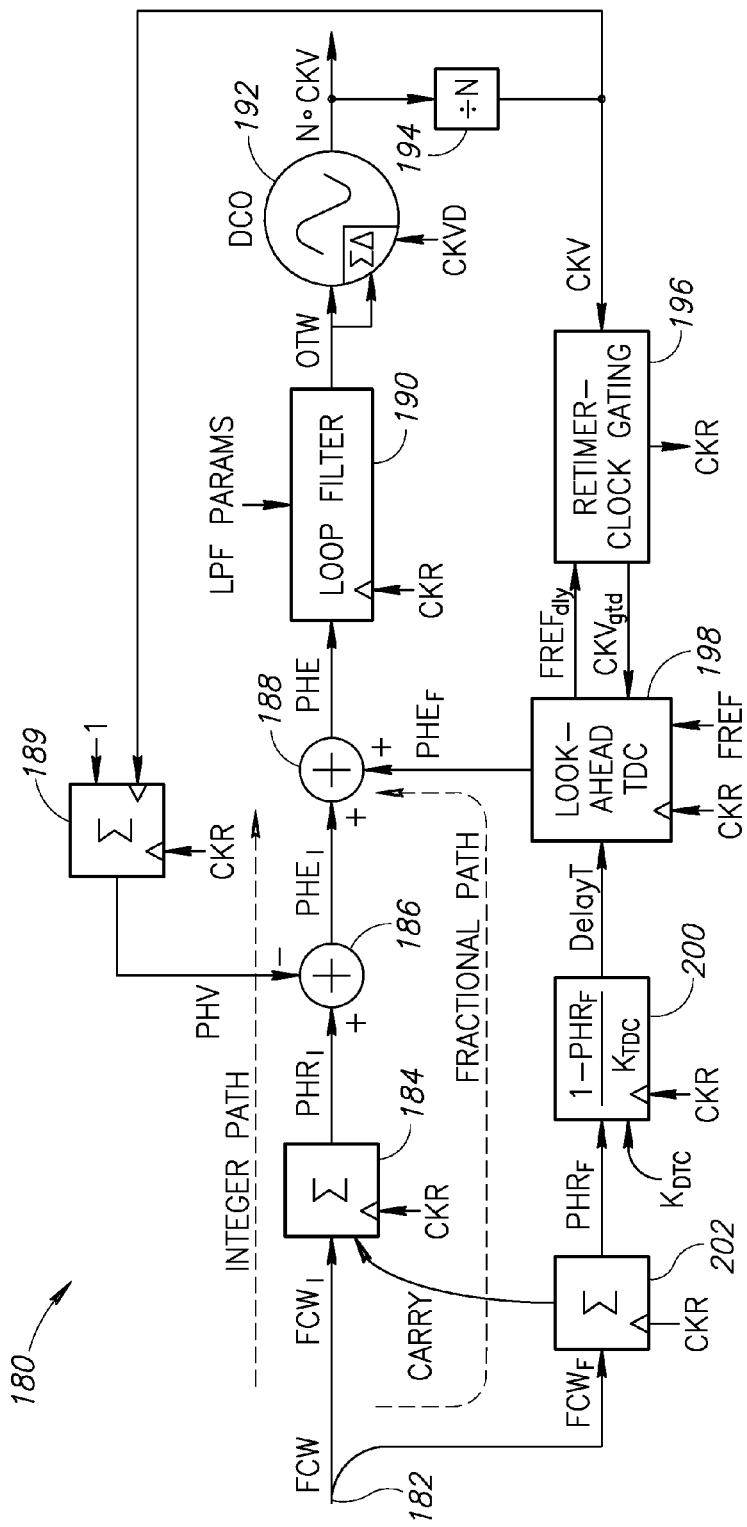
FIG. 10 is a block diagram illustrating an example all digital phase locked loop incorporating the oscillator of the present invention.

A block diagram illustrating an example all digital phase locked loop (ADPLL) incorporating the oscillator of the present invention is shown in FIG. 10. The frequency command word (FCW) 182 is split into its integer $FCW_I$ and fractional parts $FCW_F$, with separate reference accumulators 184, 202 that generate the integer and fractional part of the reference phase, $PHR_I$ and $PHR_F$, respectively. In order to properly accumulate the FCW as a whole, a carry is transferred to the integer accumulator whenever an overflow of the fractional part occurs. A synchronous 8-bit counter serves as the variable accumulator and produces the variable phase PHV that is subtracted from $PHR_I$ via subtractor 186 to provide the integer part of the phase error $PHE_I$. $PHR_F$ is used to calculate the TDC delay code based on the estimated delay characteristic of the TDC, which in turn is applied to the look-ahead TDC 198 through a gain. A TDC gain estimation block 200, based on an iterative adaptation algorithm, is implemented on chip to dynamically track delay estimation errors due to PVT variations. The digitized output of the TDC represents the fractional part of the phase error, $PHE_F$ that is combined with $PHE_I$ via summer 188 to yield the total fixed-point representation of the phase error PHE.

The phase error PHE is then filtered via loop filter 190, in order to properly set the dynamics of the loop. A reconfigurable proportional integral controller within the loop filter block 190 is followed by a DCO decoder also within the loop filter block 190 to generate the oscillator tuning word (OTW). The DCO 192 comprises the DCO circuit described supra in connection with FIGS. 2A, 2B, 2C and includes switched capacitor banks that are dithered using a $2^{nd}$-order MASH ΣΔ modulator in order to achieve a lower equivalent frequency resolution and push the quantization noise at higher offset frequencies where they are more easily filtered out and do not contribute significantly to the total jitter. The operation frequency of the ΣΔ modulators can be dynamically selected between different divider versions of the oscillator output in order to meet the required performance as a trade-off between power consumption and jitter.

In one embodiment, for the feasibility of the variable accumulator implementation, the feedback path was chosen to operate at a maximum 2.5 GHz, which means that a divide-by-eight version of the transformer-based DCO output is fed back to the variable accumulator and the look-ahead TDC. Division by eight is achieved using a current mode logic (CML) ÷4 divider cascaded with a CMOS digital divider.

These dividers are represented in FIG. 10 by the ÷N block 194. Since the loop feedback operates on a divided version of the output, the effective frequency command word is adjusted accordingly. Therefore, one eighth of the multiplication ratio is accumulated at the ADPLL.

As mentioned supra, the retimer clock gating circuit 196 generates the clock signals for the ADPLL. The CKR clock is used as a global digital clock of the ADPLL loop (at the reference clock rate) to resample the output of the variable accumulator and to generate a gated version of the variable feedback clock $CKV_{gtd}$.

Figure 11:
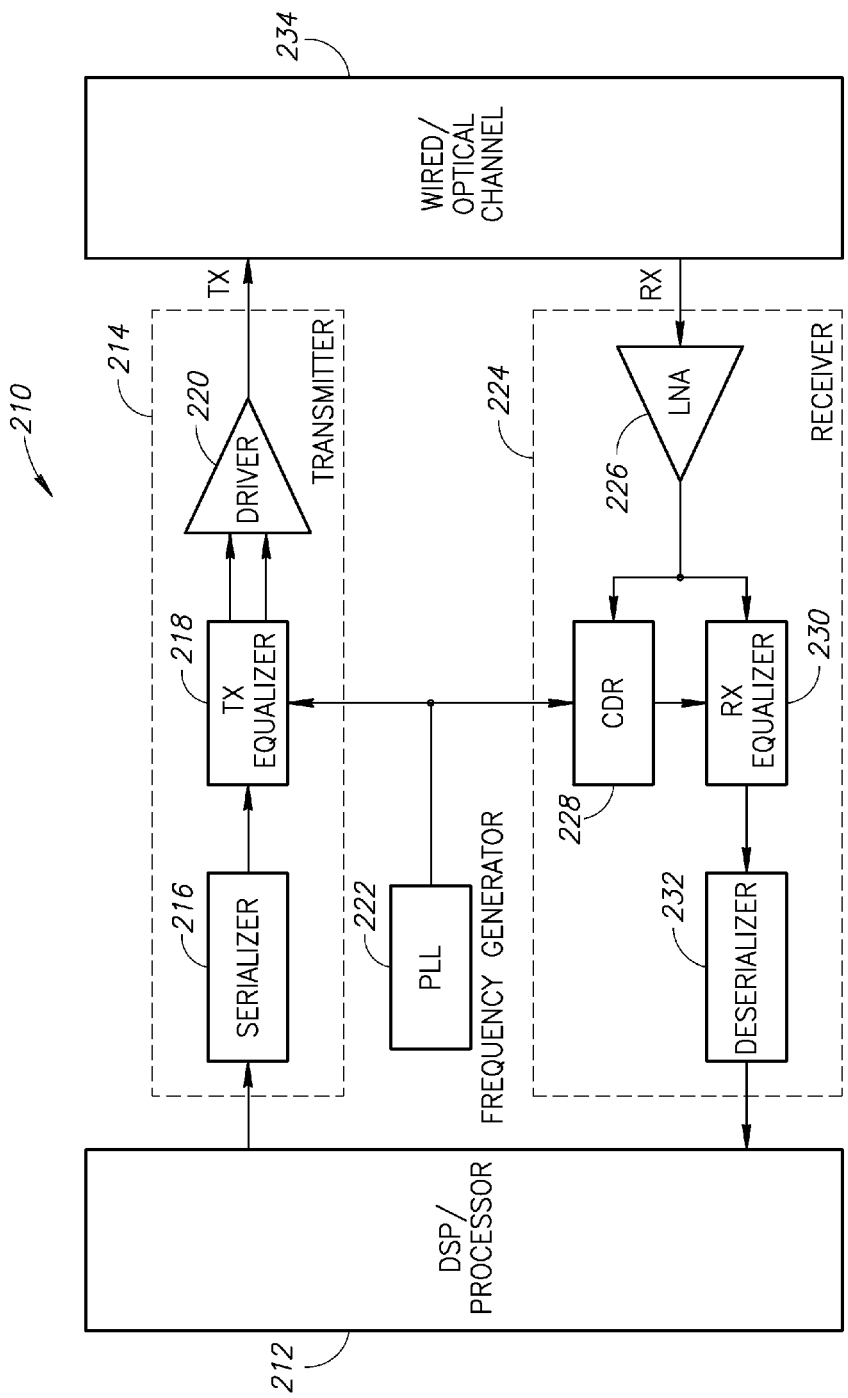
FIG. 11 is a block diagram illustrating an example wireline transceiver incorporating the oscillator of the present invention.

A block diagram illustrating an example wireline transceiver incorporating the oscillator of the present invention is shown in FIG. 11. The transceiver, generally referenced 210, comprises a DSP/processor (including a baseband processor in one embodiment) 212, transmitter 214, receiver 224, PLL based frequency generator 222 and the channel (e.g., wired or optical) 234. The transmitter 214 comprises a serializer 216, TX equalizer 218 and driver 220. The receiver 224 comprises a low noise amplifier (LNA) 226, RX equalizer 230, clock data recovery (CDR) 228 and deserializer 232.

In this example embodiment, the frequency generator 222 comprises the ADPLL incorporating the transformer-based DCO as described supra in connection with FIG. 10. The transformer based ADPLL makes use of the intrinsically better spectrum purity offered by LC DCOs within a tiny area. It efficiently trades silicon area with jitter while offering a wide tuning range which is highly desirable in wireline systems.

Moreover, the transformer based ADPLL provides (1) a >45% tuning range, (2) very small frequency pushing and (3) using the split transformer topology described supra, more robustness to common-mode magnetic field interference which is highly desirable in very spectrally polluted environments commonly found in SoCs.

Mobile Device Incorporating the Split Transformer DCO

Figure 12:
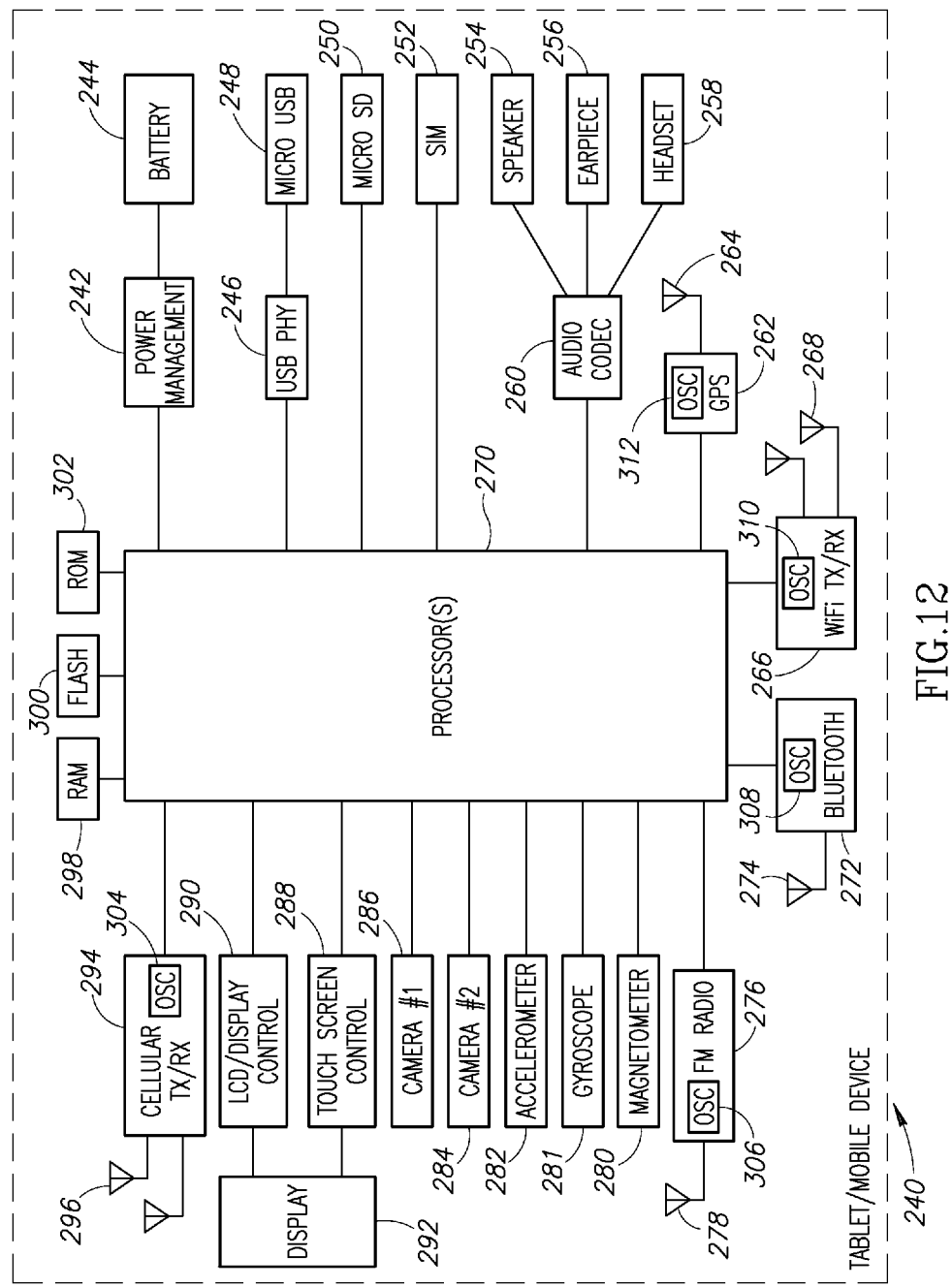
FIG. 12 is a block diagram illustrating an example mobile device incorporating the oscillator of the present invention.

A block diagram illustrating an example mobile device incorporating the digitally controlled oscillator of the present invention is shown in FIG. 12. The mobile device is preferably a two-way communication device having voice and/or data communication capabilities. In addition, the device optionally has the capability to communicate with other computer systems via the Internet. Note that the mobile device may comprise any suitable wired or wireless device such as multimedia player, mobile communication device, digital still or video camera, cellular phone, smartphone, iPhone, PDA, PNA, Bluetooth device, tablet computing device such as the iPad or other iOS device, Android device, Surface, Nexus, Google Glass, etc. For illustration purposes only, the device is shown as a mobile device, such as a cellular based telephone, smartphone or superphone. Note that this example is not intended to limit the scope of the DCO as the invention can be implemented in a wide variety of communication devices. It is further appreciated the mobile device shown is intentionally simplified to illustrate only certain components, as the mobile device may comprise other components and subsystems beyond those shown.

The mobile device, generally referenced 240, comprises one or more processors 270 which may comprise a baseband processor, CPU, microprocessor, DSP, etc., optionally having both analog and digital portions. The mobile device may comprise a plurality of cellular radios 294 and associated antennas 296. Radios for the basic cellular link and any number of other wireless standards and Radio Access Technologies (RATs) may be included. Examples include, but are not limited to, Third Generation (3G) Long Term Evolution (LTE), Code Division Multiple Access (CDMA), Personal Communication Services (PCS), Global System for Mobile Communication (GSM)/GPRS/EDGE 3G; WCDMA; WiMAX for providing WiMAX wireless connectivity when within the range of a WiMAX wireless network; Bluetooth for providing Bluetooth wireless connectivity when within the range of a Bluetooth wireless network; WLAN for providing wireless connectivity when in a hot spot or within the range of an ad hoc, infrastructure or mesh based wireless LAN (WLAN) network; near field communications; UWB; GPS receiver for receiving GPS radio signals transmitted from one or more orbiting GPS satellites, FM transceiver provides the user the ability to listen to FM broadcasts as well as the ability to transmit audio over an unused FM station at low power, such as for playback over a car or home stereo system having an FM receiver, digital broadcast television, etc.

The mobile device may also comprise internal volatile storage 298 (e.g., RAM) and persistent storage 302 (e.g., ROM) and flash memory 300. Persistent storage 302 also stores applications executable by processor(s) 270 including the related data files used by those applications to allow device 240 to perform its intended functions. Several optional user-interface devices include trackball/thumbwheel, which may comprise a depressible thumbwheel/trackball that is used for navigation, selection of menu choices and confirmation of action, keypad/keyboard such as arranged in QWERTY fashion for entering alphanumeric data and a numeric keypad for entering dialing digits and for other controls and inputs (the keyboard may also contain symbol, function and command keys such as a phone send/end key, a menu key and an escape key), headset 258, earpiece 256 and/or speaker 254, microphone(s) and associated audio codec 260 or other multimedia codecs, vibrator for alerting a user, one or more cameras and related circuitry 286, 284, display(s) 292 and associated display controller 290 and touchscreen control 288. Serial ports include a micro USB port 248 and related USB PHY 246 and micro SD port 250. Other interface connections may include SPI, SDIO, PCI, USB, etc. for providing a serial link to a user's PC or other device. SIM/RUIM card 252 provides the interface to a user's SIM or RUIM card for storing user data such as address book entries, user identification, etc.

Portable power is provided by the battery 244 coupled to power management circuitry 242. External power is provided via USB power or an AC/DC adapter connected to the power management circuitry that is operative to manage the charging and discharging of the battery. In addition to a battery and AC/DC external power source, additional optional power sources each with its own power limitations, include: a speaker phone, DC/DC power source, and any bus powered power source (e.g., USB device in bus powered mode).

Operating system software executed by the processor 270 is preferably stored in persistent storage (i.e. ROM 302), or flash memory 300, but may be stored in other types of memory devices. In addition, system software, specific device applications, or parts thereof, may be temporarily loaded into volatile storage 298, such as random access memory (RAM). Communications signals received by the mobile device may also be stored in the RAM.

The processor 270, in addition to its operating system functions, enables execution of software applications on the device 240. A predetermined set of applications that control basic device operations, such as data and voice communications, may be installed during manufacture. Additional applications (or apps) may be downloaded from the Internet and installed in memory for execution on the processor. Alternatively, software may be downloaded via any other suitable protocol, such as SDIO, USB, network server, etc.

Other components of the mobile device include an accelerometer 282 for detecting motion and orientation of the device, gyroscope 281 for measuring or maintaining orientation, magnetometer 280 for detecting the earth's magnetic field, FM radio 276 and antenna 278, Bluetooth radio 272 and antenna 274, Wi-Fi radio 266 including antenna 268 and GPS 262 and antenna 264.

In accordance with the invention, the mobile device 240 comprises one or more DCO circuits of the present invention. Numerous embodiments of the mobile device 240 may comprise a DCO circuit 304 as described supra incorporated in the one or more cellular radios 294; a DCO circuit 306 as described supra incorporated in the FM radio 276; a DCO circuit 308 as described supra incorporated in the Bluetooth radio 272; a DCO circuit 310 as described supra incorporated in the Wi-Fi radio 266; and a DCO circuit 312 as described supra incorporated in the GPS radio 262.

The DCO of the present invention has been fabricated in a digital low-power 40 nm CMOS technology having an active area of 0.0625 mm². The FoM and FoM$_T$ of the transformer-based DCO are 175 dB and 188 dB, respectively. The transformer-based DCO operates at 1 V supply. For the transformer-based ADPLL described supra, the worst fractional spur measured was −47 dBc and the reference spur −56 dBc. The maximum integrated jitter (from 10 kHz to 100 MHz) measured 0.78 ps$_{rms}$. The fractional spurs were located outside the ADPLL loop bandwidth since the target application (e.g., wireline systems) does not require such small fractional-N channels. The DCO of the present invention thus offers a very efficient way to trade off area with jitter, while keeping power efficiency best-in-class. The DCO achieves this by incorporating the advantages of both worlds, i.e. from the superior quality factors of LC tanks to the small size and wide tuning range of a RO which has utility in numerous applications, such as mobile devices and wireline systems.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. An oscillator, comprising:
   a passive LC-tank circuit having an input and an output;
   an active circuit coupled to said passive circuit, said active circuit having an input coupled to the output of said passive circuit and an output coupled to the input of said passive circuit;
   said passive circuit comprising two independent transformers whose primary windings are coupled between said active circuit outputs and whose secondary windings are coupled between said active circuit inputs; and
   wherein said two independent transformers are oriented such that the magnetic fields generated by their windings are in opposite direction to each other.

2. The oscillator according to claim 1, wherein said independent transformers comprise two independent multi-turn single ended transformers.

3. The oscillator according to claim 1, wherein each said independent transformer is situated substantially symmetrically to a center of said oscillator thereby effecting the cancellation of their magnetic fields.

4. The oscillator according to claim 1, wherein passive LC-tank circuit comprises a plurality of digitally controlled banks of switched capacitors associated with said primary windings and said secondary windings.

5. The oscillator according to claim 4, wherein one or more capacitor banks comprises at least one of a coarse tuning capacitor bank, mid-coarse tuning capacitor bank and fine tuning capacitor bank.

6. The oscillator according to claim 1, wherein a terminal of said secondary windings is coupled to a bias voltage.

7. The oscillator according to claim 6, wherein said bias voltage is coupled to a supply voltage via an RC low pass filter.

8. An oscillator, comprising:
   a passive LC-tank circuit having an input and an output;
   an active circuit coupled to said passive circuit, said active circuit having an input coupled to the output of said passive circuit and an output coupled to the input of said passive circuit;
   said passive circuit comprising first and second independent transformers each having a primary winding and a secondary winding, the primary windings of said first and second transformers coupled between a supply voltage and a respective active circuit output, the secondary windings of said first and second transformers coupled between a bias voltage and a respective active circuit input; and
   wherein use of two independent transformers rather than a substantially equivalent single transformer is operative to achieve a significant reduction in chip area.

9. The oscillator according to claim 8, wherein said passive LC-tank circuit comprises a plurality of digitally controlled switched capacitor banks associated with said primary windings and said secondary windings.

10. The oscillator according to claim 9, wherein one or more capacitor banks comprises at least one of a coarse tuning capacitor bank, mid-coarse tuning capacitor bank and fine tuning capacitor bank.

11. The oscillator according to claim 8, wherein said first and second transformers are configured to provide a passive voltage gain for sustaining operation of the oscillator.

12. The oscillator according to claim 8, wherein said first and second transformers are driven differentially.

13. The oscillator according to claim 8, wherein said bias voltage is coupled to a supply voltage via an RC low pass filter.

14. The oscillator according to claim 8, wherein said first and second independent transformers are oriented such that the magnetic fields generated by their windings are in opposite direction to each other.

15. A digitally controlled oscillator (DCO), comprising:
a semiconductor substrate;
a passive LC-tank circuit having an input and an output;
an active circuit coupled to said passive circuit, said active circuit having an input coupled to the output of said passive circuit and an output coupled to the input of said passive circuit;
said passive circuit comprising first and second independent transformers each having a primary winding and a secondary winding, the primary windings of said first and second transformers coupled between a supply voltage and a respective active circuit output, the secondary windings of said first and second transformers coupled between a bias voltage and a respective active circuit input;
a plurality of digitally controlled switched capacitor banks divided between said primary and secondary windings of said first and second transformers, said plurality of switched capacitor banks operative to provide frequency tuning of said DCO; and
wherein said first and second transformers are situated on said substrate such that the magnetic fields generated by their windings are in opposite direction to each other.

16. The oscillator according to claim 15, wherein said plurality of switched capacitor banks comprise at least one coarse tuning switched capacitor bank, at least one mid-coarse tuning switched capacitor bank and at least one fine tuning switched capacitor bank.

17. The oscillator according to claim 15, wherein said plurality of switched capacitor banks comprises a plurality of differential switched capacitor units.

18. The oscillator according to claim 15 wherein said first and second transformers have a turns ratio that provides a passive voltage gain.

19. The oscillator according to claim 15, further comprising bias voltage filtering thereby reducing sensitivity of said DCO to dynamic variations in supply voltage.

20. The oscillator according to claim 19, wherein said bias voltage is coupled to a supply voltage via an RC low pass filter.

* * * * *